(12) United States Patent
Bradley

(10) Patent No.: US 8,493,111 B1
(45) Date of Patent: Jul. 23, 2013

(54) ULTRA HIGH FREQUENCY RESOLUTION FRACTIONAL N SYNTHESIZER

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 165 days.

(21) Appl. No.: 13/191,767

(22) Filed: Jul. 27, 2011

(51) Int. Cl.
*H03L 7/06* (2006.01)

(52) U.S. Cl.
USPC .......................................... 327/156; 327/147

(58) Field of Classification Search
USPC ................................. 327/147, 156
See application file for complete search history.

(56) References Cited

U.S. PATENT DOCUMENTS

| | | | | |
|---|---|---|---|---|
| 7,772,896 | B2 * | 8/2010 | Bratschke et al. | 327/156 |
| 2007/0018732 | A1 * | 1/2007 | Mattisson | 331/2 |
| 2008/0069286 | A1 * | 3/2008 | Staszewski et al. | 375/376 |
| 2009/0262877 | A1 * | 10/2009 | Shi et al. | 375/376 |
| 2012/0043999 | A1 * | 2/2012 | Quevy et al. | 327/147 |

* cited by examiner

*Primary Examiner* — Adam Houston

(57) ABSTRACT

Systems and methods are provided for improving frequency resolution in a phase locked loop having an oscillator and a phase detector. A method comprises receiving a reference signal and generating an output signal having a phase relationship with the reference signal and receiving the output signal at a fractional divider connected between the oscillator and the phase detector in a feedback loop, wherein the fractional divider includes a plurality of configurable parameters. The method also comprises adjusting a value of the modulus parameter to increase frequency resolution.

21 Claims, 4 Drawing Sheets

ULTRA HIGH FREQUENCY RESOLUTION FRACTIONAL N SYNTHESIZER

BACKGROUND

1. Technical Field

The present invention relates to phase locked loops and in particular to an ultra high frequency resolution fractional N synthesizer.

2. Related Art

Phase Locked Loops (PLLs) are control systems which are used to match the phase of an output signal to that of an input (reference) signal. FIG. 1 shows a block diagram of a prior art phase locked loop. Generally, phase locked loops include a phase detector 100, an oscillator 102, such as a voltage controlled oscillator (VCO), and a feedback network 104 connecting the programmable oscillator to the phase detector. The phase detector receives inputs of a reference signal 106 and the output of the feedback network. The phase detector outputs a signal based on the difference in phase between the two inputs, which is then sent to the oscillator. Based on the signal received from the phase detector, the oscillator outputs an output signal 108 which is also sent back to the phase detector through the feedback network. Using feedback, the phase locked loop automatically adjusts the oscillator to keep the output signal in phase with the reference signal.

SUMMARY

Systems and methods are provided for improving frequency resolution in a phase locked loop. A method comprises receiving a reference signal and a feedback signal at a phase detector, generating an output signal having a phase relationship with the reference signal and receiving the output signal at a fractional divider connected between the oscillator and the phase detector in a feedback loop. The fractional divider can include a plurality of configurable parameters. The method also comprises adjusting a value of the modulus parameter to increase frequency resolution.

BRIEF DESCRIPTION OF THE DRAWINGS

Further details of the present invention are explained with the help of the attached drawings in which.

DETAILED DESCRIPTION

Fractional Division Phase Locked Loops are a type of phase locked loops which provide high frequency resolution related to the phase detector reference frequency. This ratio can be described as the reference frequency/modulus, where the modulus is the denominator of the fractional divider. Frequency resolution is the smallest frequency increment a particular phase locked loop is capable of. For example, if the system has a frequency resolution of 100 KHz, then the system can output signals in 100 KHz increments: 1000 KHz, 1100 KHz, 1200 KHz, etc.

In accordance with an embodiment, systems and methods are provided for improving frequency resolution in a phase locked loop. A method comprises receiving a reference signal and a feedback signal at a phase detector, generating an output signal having a phase relationship with the reference signal and receiving the output signal at a fractional divider connected between the oscillator and the phase detector in a feedback loop. The fractional divider can include a plurality of configurable parameters. The method also comprises adjusting a value of the modulus parameter to increase frequency resolution. The reference signal and a feedback signal can be received at the phase detector. The method can also comprise sending an error signal, based on a difference in phase between the reference signal and the feedback signal, from the phase detector to the oscillator. The output signal can be generated by the oscillator based on the error signal.

Figure 1:
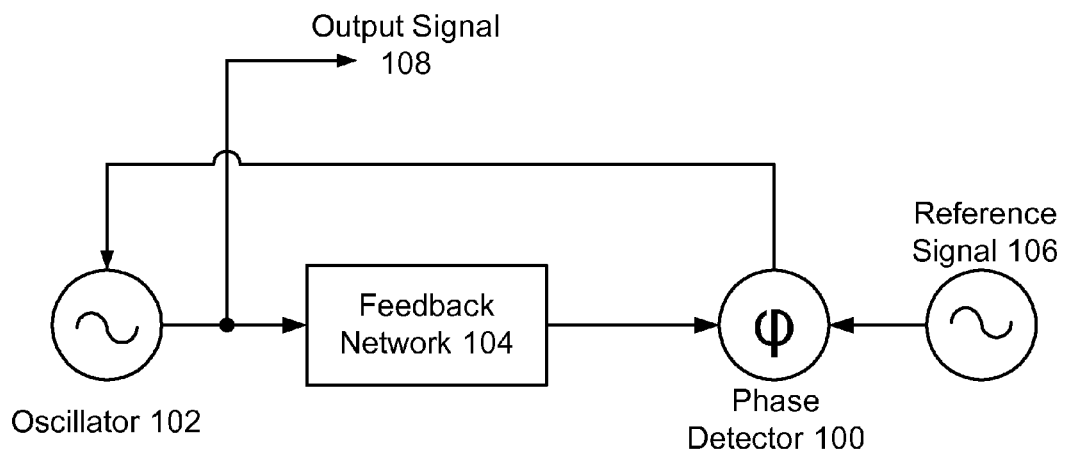
FIG. 1 shows a block diagram of a prior art phase locked loop.
Figure 2:
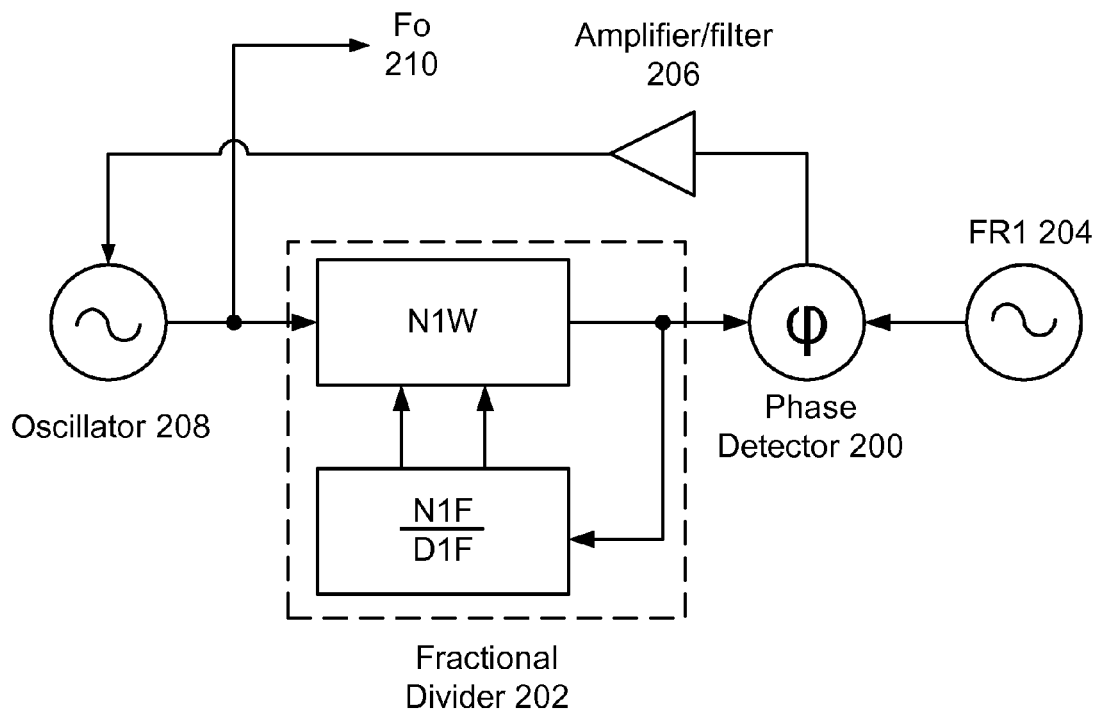
FIG. 2 shows a block diagram of a fractional division phase locked loop, in accordance with an embodiment.

FIG. 2 shows a block diagram of a fractional division phase locked loop, in accordance with an embodiment. As shown in FIG. 2, a phase detector 200 receives inputs from a fractional divider 202 and a reference signal $F_{R1}$ 204. The phase detector generates an error signal based on a difference in phase between the feedback signal and the reference signal. This error signal is passed through an amplifier or filter 206 before being passed to an oscillator 208. The oscillator then generates an output signal Fo 210, based on the error signal. The phase locked loop is designed to keep the output signal in phase with the reference signal. Using the feedback loop, if the phase of the output signal begins to diverge from that of the reference signal, then the error signal adjusts to compensate.

In FIG. 2, the fractional divider includes a plurality of configurable parameters. The output signal can be represented as a function of the reference signal and the fractional divider. The fractional divider includes an integer parameter (N1W), fractional parameter (N1F) and a modulus parameter (D1F). An equation showing the output signal as a function of the reference signal and the fractional divider is shown below in Equation 1.

$$F_0 = F_{R1}\left(N1W + \frac{N1F}{D1F}\right) \quad (1)$$

In practice, a system will generally require an output signal of a particular frequency and a particular frequency resolution. Typically, in a phase locked loop such as that shown in FIG. 2, the fractional parameter (N1F) is used as a variable, with all other parameters held constant based on the particular requirements of a given system. When N1F is used as a variable, the frequency resolution can be calculated according to Equation 2, below.

$$F_{resolution} = F_{o(N1F=1)} - F_{o(N1F=0)} \quad (2)$$

The frequency resolution ($F_{resolution}$) equals the output frequency ($F_o$) when N1F=1 minus the output frequency when N1F=0. As shown below in Equation 3, the frequency resolution equals the reference frequency ($F_{R1}$) divided by the modulus parameter (D1F).

$$F_{resolution} = F_{R1}\left(N1W + \frac{1}{D1F}\right) - F_{R1}\left(N1W + \frac{0}{D1F}\right) = \frac{F_{R1}}{D1F} \quad (3)$$

However, in accordance with an embodiment, the frequency resolution can be improved without changing the hardware configuration of the phase locked loop by using the value of the D1F parameter as a variable, while holding the integer and fractional parameters constant. As shown below in Equation 4, when D1F is used as a variable, the frequency resolution is equal to the output frequency, where D1F is equal to the maximum value of D1F minus one ($Fo_{D1Fmax-1}$), minus the output frequency where D1F is equal to the maximum value of D1F ($Fo_{D1Fmax}$).

$$F_{resolution} = F_{o(D1F=D1Fmax-1)} - F_{o(D1F=D1Fmax)} \quad (4)$$

Equation 4 can then be reduced, as shown below in Equation 5.

$$F_{resolution} = F_{R1}\left(N1W + \frac{N1F}{D1F_{max}-1}\right) - F_{R1}\left(N1W + \frac{N1F}{D1F_{max}}\right) \quad (5)$$

$$= F_{R1}\left[\left(N1W + \frac{N1F}{D1F_{max}-1}\right) - \left(N1W + \frac{N1F}{D1F_{max}}\right)\right]$$

$$= F_{R1}\left[\left(\frac{N1F*D1F_{max} - N1W + N1F}{D1F_{max}-1}\right) - \left(\frac{N1F*D1F_{max} + N1F}{D1F_{max}}\right)\right]$$

$$= F_{R1}\frac{N1F}{(D1F_{max}-1)(D1F_{max})}$$

Thus, for values of $D1F_{max}$ much greater than one ($D1F_{max} \gg 1$), the frequency resolution can be estimated as shown below in Equation 6.

$$\text{for } D1F_{max} \gg 1$$

$$F_{resolution} = F_{R1}\frac{N1F}{(D1F_{max})^2} \quad (6)$$

In accordance with an embodiment, for small values of N1F, this has effectively increased the frequency resolution by the modulus squared or doubled the number of bits in the binary fractional divider word.

Figure 3:
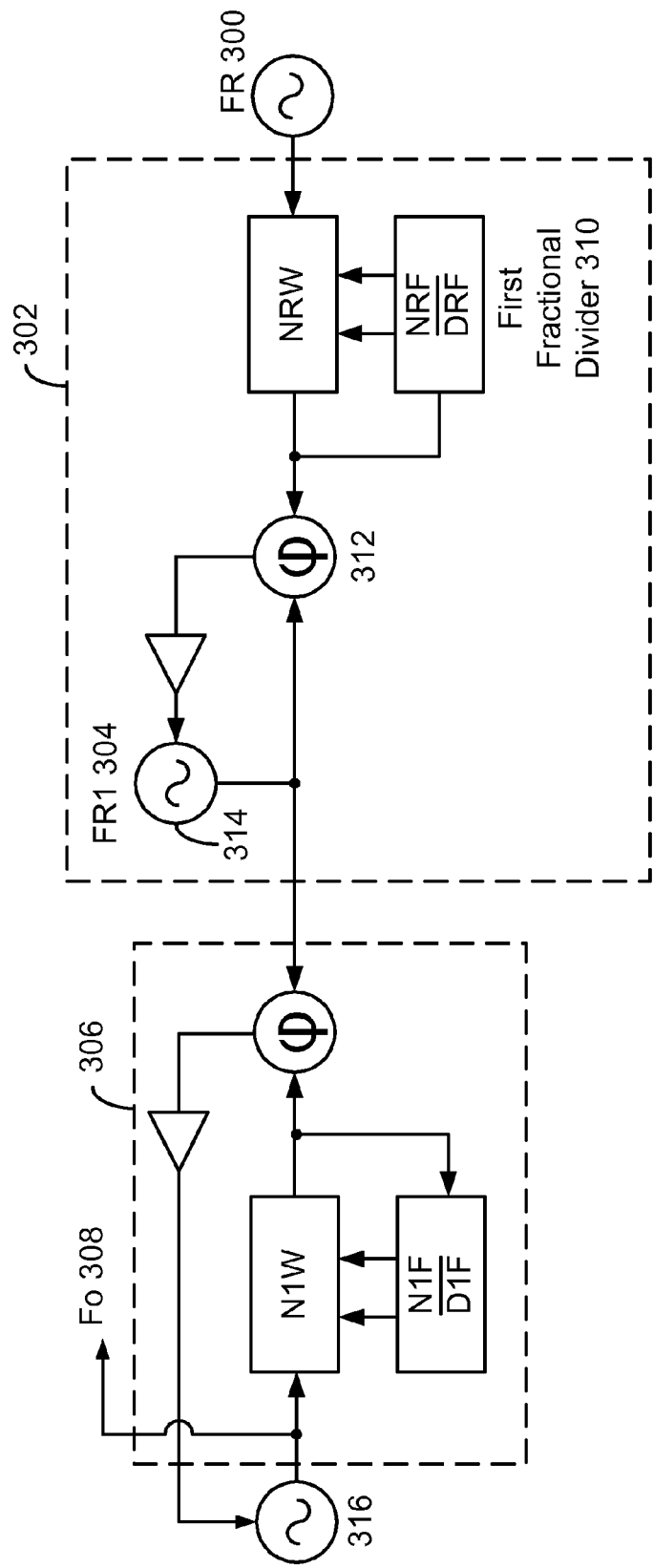
FIG. 3 shows a block diagram of a system that improves frequency resolution of a fractional division phase locked loop, in accordance with an embodiment.

FIG. 3 shows a block diagram of a system that improves frequency resolution of a fractional division phase locked loop, in accordance with an embodiment. As shown in FIG. 3, a reference signal FR 300 is received at a first fractional division phase locked loop 302. The first fractional division phase locked loop controls a reference signal FR1 304, which is received by a second fractional division phase locked loop 306 which produces output signal Fo 308. By using two fractional division phase locked loops, more parameters are available to control, thereby making it easier to improve the frequency resolution of the system.

Reference signal $F_R$ is passed through a first fractional divider 310 which includes a plurality of configurable parameters including an integer parameter NRW, a fractional parameter NRF and a modulus parameter DRF. In accordance with an embodiment, $F_R$ can be provided by a traditional lumped element oscillator or a SAW oscillator if the frequency is in the hundreds of MHz range. Alternatively, in accordance with an embodiment, if NRW is kept small (or 1), then a quartz oscillator can be used. In practice, hardware constraints on devices, such as fractional dividers that can provide the integer+fractional/modulus function, i.e., NRW+NRF/DRF, have minimum integer (NRW) values in the 50 to 80 range, forcing $F_R$ to be in the GHz range.

The output of the first fractional divider is sent to a first phase detector 312. In addition to the output of the first fractional divider, the first phase detector also receives the second reference signal $F_{R1}$. The first phase detector outputs an error signal which is used to control a first oscillator 314 which outputs the second reference signal $F_{R1}$. In accordance with an embodiment, the first oscillator can be a low noise quartz oscillator or equivalent. In accordance with an embodiment, the first oscillator is a quartz high Q (quality factor) oscillator, the noise of which will be multiplied by 20*log N1W.

In this configuration, the second reference signal is controlled to match the output of the first frequency divider, as shown in Equation 7.

$$F_{R1} = \frac{F_R}{\left(NRW + \frac{NRF}{DRF}\right)} \quad (7)$$

In accordance with an embodiment, and as illustrated in FIG. 3, reference signal $F_{R1}$ can then be used as an input to the second phase locked loop 306. The second phase locked loop, similar to that described above with respect to FIG. 2, is used to control the output signal Fo, from a second oscillator 316, to track the reference signal $F_{R1}$. In accordance with an embodiment, the second oscillator can be a low noise quartz oscillator or equivalent.

Plugging Equation 7 into Equation 1, yields Equation 8 which shows the relationship of the output signal Fo to the reference signal $F_R$.

$$F_o = F_R \left(\frac{NIW + \frac{NIF}{D1F}}{NRW + \frac{NRF}{DRF}}\right) \quad (8)$$

In accordance with an embodiment, the system shown in FIG. 3 can be configured to use the numerator of the first fractional divider as a variable. The frequency resolution of this configuration can be derived by plugging Equation 8 into Equation 2. For values of NRW*DRF>>1, the equation for frequency resolution in this configuration simplifies to Equation 9, shown below.

$$F_{resloution} = F_R\left(\frac{N1W + \frac{N1F}{D1F}}{NRW^2 * DRF}\right) \quad (9)$$

In this configuration, the system shown in FIG. 3 has similar frequency resolution to that in FIG. 2, as shown by the following example. Assuming the following parameter values:

TABLE 1

Exemplary Parameter Values

| $F_R$ | N1W | N1F | D1F | NRW | NRF | DRF |
|---|---|---|---|---|---|---|
| 4025 MHz | 161 | 1 | 4095 | 161 | 1 | 4095 |

Using the parameter values listed in Table 1, and Equations 7, 8 and 9, $F_{R1}$, Fo and $F_{resolution}$ can be calculated. In this example, $F_{R1}$ is 24.999962 MHz, Fo is 4025 MHz and $F_{resolution}$ is 6105 Hz. This matches the frequency resolution of the phase locked loop shown in FIG. 2 which, assuming $F_{R1}$ to be 25 MHz and D1F to be 4095, and using Equation 3, is 6105 Hz.

If, however, the system shown in FIG. 3 is configured to use the denominator of the first fractional divider as a variable, frequency resolution can be improved. The frequency resolution of this configuration can be derived by plugging Equation 8 into Equation 4. For values of $DRF_{max} \gg 1$, the equation for frequency resolution in this configuration simplifies to Equation 10, shown below.

$$F_{resolution} = F_R \left( N1W + \frac{N1F}{D1F} \right)\left( \frac{NRF}{(NRW*DRF + NRF)^2} \right) \quad (10)$$

Using the exemplary parameter values listed in Table 1, and Equations 7, 8 and 10, $F_{R1}$, Fo and $F_{resolution}$ can be calculated. In this example, $F_{R1}$ is 24.999962 MHz, Fo is 4025 MHz and $F_{resolution}$ is 1.49 Hz. This frequency resolution approaches 6105 Hz as the value of NRF approaches that of DRF. This also matches the frequency resolution of the phase locked loop shown in FIG. 2 when the D1F parameter is used as a variable. However, in the system shown in FIG. 3 more parameters are available to keep the value of NRF low. For example, NRF can be set to one, while N1W, N1F, D1F, and NRW are adjusted based on system requirements.

Figure 4:
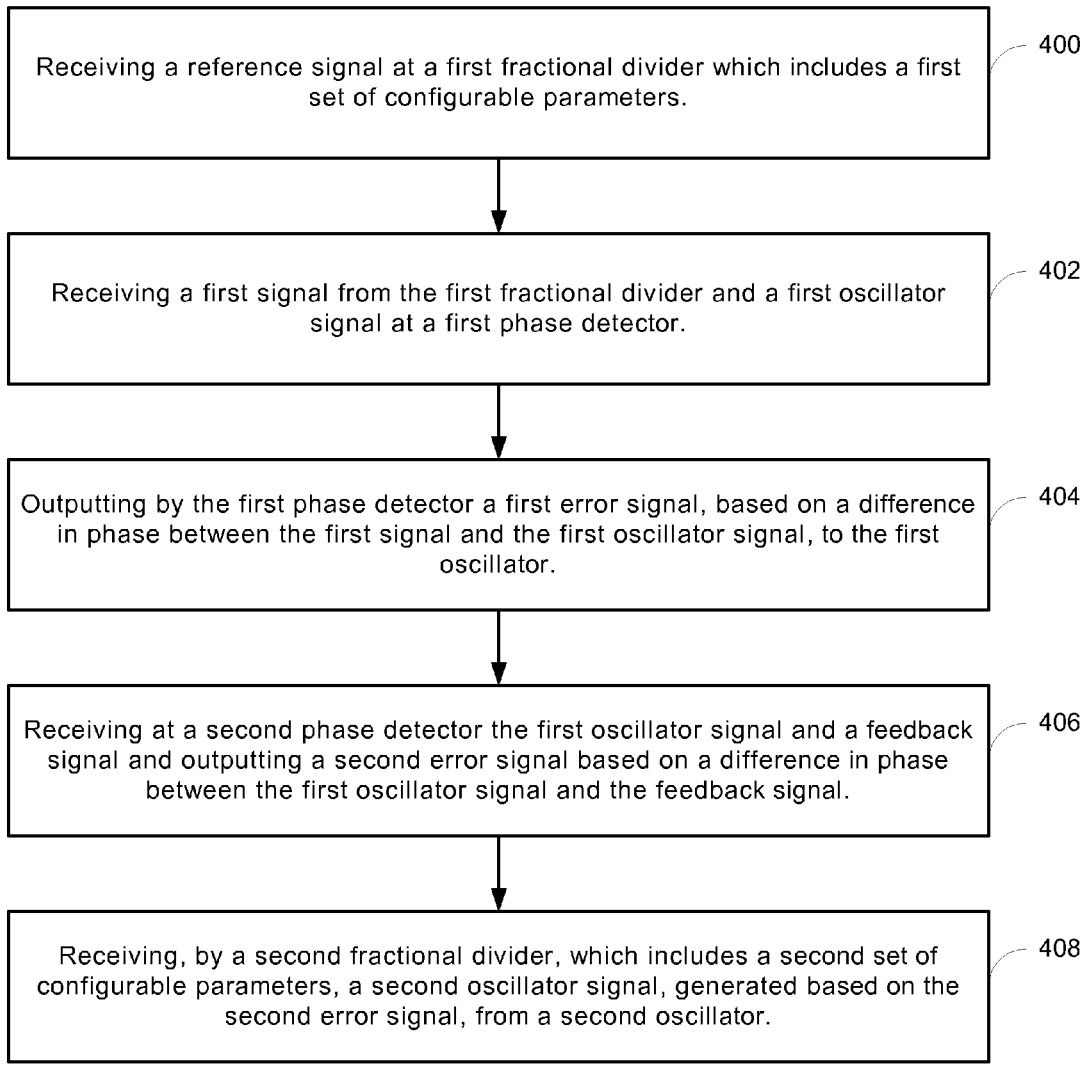
FIG. 4 shows a method for improving frequency resolution in a phase locked loop, in accordance with an embodiment.

FIG. 4 shows a method for improving frequency resolution in a phase locked loop, in accordance with an embodiment. At step 400, a reference signal is received at a first fractional divider which includes a first set of configurable parameters. At step 402, a first signal from the first fractional divider and a first oscillator signal are received at a first phase detector. At step 404, the first phase detector outputs a first error signal, based on a difference in phase between the first signal and the first oscillator signal, to the first oscillator. At step 406, a second phase detector receives the first oscillator signal and a feedback signal and outputs a second error signal based on a difference in phase between the first oscillator signal and the feedback signal. At step 408, a second fractional divider, which includes a second set of configurable parameters, receives a second oscillator signal, generated based on the second error signal, from a second oscillator.

In accordance with an embodiment, the method shown in FIG. 4 can further comprise outputting the feedback signal from the second fractional divider to the second phase detector. Additionally, the first and second oscillators can be low noise quartz oscillators. The first and second sets of configurable parameters can each include an integer parameter, a fractional parameter and the modulus parameter.

In accordance with an embodiment, the method shown in FIG. 4 can further comprise setting fixed values are set each of the configurable parameters in the second set of configurable parameters and for the integer parameter of the first set of configurable parameters, based on system requirements.

In accordance with an embodiment, the method shown in FIG. 4 can further comprise adjusting a value of the modulus parameter of the first set of configurable parameters to increase frequency resolution; and setting a fixed value for the fractional parameter of the first set of configurable parameters, based on system requirements. Alternatively, the method shown in FIG. 4 can further comprise adjusting a value of the fractional parameter of the first set of configurable parameters to increase frequency resolution; and setting a fixed value for the fractional parameter of the first set of configurable parameters, based on system requirements.

Although the present invention has been described above with particularity, this was merely to teach one of ordinary skill in the art how to make and use the invention. Many additional modifications will fall within the scope of the invention, as that scope is defined by the following claims.

What is claimed:

1. A method for improving frequency resolution in a phase-locked loop having an oscillator and a phase detector, comprising:
   receiving a reference signal and generating an output signal having a phase relationship with the reference signal;
   wherein a phase of the reference signal is controllable by a reference phase-locked loop;
   receiving the output signal at a fractional divider connected between the oscillator and the phase detector in a feedback loop, wherein the fractional divider includes a plurality of configurable parameters; and
   adjusting a value of a modulus parameter, in the plurality of configurable parameters, to increase frequency resolution.

2. The method of claim 1, further comprising:
   wherein the reference signal and a feedback signal are received at the phase detector;
   sending an error signal, based on a difference in phase between the reference signal and the feedback signal, from the phase detector to the oscillator; and
   wherein the output signal is generated by the oscillator based on the error signal.

3. The method of claim 2, wherein a maximum frequency resolution is proportional to the value of the modulus parameter squared.

4. The method of claim 2 further comprising:
   sending the feedback signal from the fractional divider to the phase detector.

5. The method of claim 2 wherein the oscillator is a low noise quartz oscillator.

6. The method of claim 1, wherein the plurality of configurable parameters includes an integer parameter, a fractional parameter and the modulus parameter.

7. The method of claim 6 further comprising:
   setting fixed values for the integer and fractional parameters, based on system requirements.

8. A system configured to provide increased frequency resolution, comprising:
   a first fractional divider which includes a first set of configurable parameters, wherein the first fractional divider receives a reference signal;
   a first phase detector which receives
      a first signal from the first fractional divider, and
      a first oscillator signal from a first oscillator;
   wherein the first phase detector outputs a first error signal, based on a difference in phase between the first signal and the first oscillator signal, to the first oscillator;
   a second phase detector which
      receives the first oscillator signal and a feedback signal, and
      outputs a second error signal based on a difference in phase between the first oscillator signal and the feedback signal; and
   a second fractional divider, which includes a second set of configurable parameters, wherein the second fractional divider receives a second oscillator signal, generated based on the second error signal, from a second oscillator.

9. The system of claim 8, wherein the second fractional divider outputs the feedback signal to the second phase detector.

10. The system of claim 8, wherein the first and second oscillators are low noise quartz oscillators.

11. The system of claim 8, wherein the first and second sets of configurable parameters each include an integer parameter, a fractional parameter and the modulus parameter.

12. The system of claim 11, wherein fixed values are set each of the configurable parameters in the second set of configurable parameters and for the integer parameter of the first set of configurable parameters, based on system requirements.

13. The system of claim 12, wherein a value of the modulus parameter of the first set of configurable parameters is adjusted to increase frequency resolution, and wherein a fixed value is set for the fractional parameter of the first set of configurable parameters, based on system requirements.

14. The system of claim 12 wherein a value of the fractional parameter of the first set of configurable parameters is adjusted to increase frequency resolution, and wherein a fixed value is set for the modulus parameter of the first set of configurable parameters, based on system requirements.

15. A method for improving frequency resolution in a phase-locked loop, comprising:
  receiving a reference signal at a first fractional divider which includes a first set of configurable parameters;
  receiving a first signal from the first fractional divider and a first oscillator signal at a first phase detector;
  outputting by the first phase detector a first error signal, based on a difference in phase between the first signal and the first oscillator signal, to a first oscillator;
  receiving at a second phase detector the first oscillator signal and a feedback signal and outputting a second error signal based on a difference in phase between the first oscillator signal and the feedback signal;
  receiving, at a second fractional divider, which includes a second set of configurable parameters, a second oscillator signal, generated based on the second error signal by a second oscillator.

16. The method of claim 15, further comprising:
  outputting the feedback signal from the second fractional divider to the second phase detector.

17. The method of claim 15, wherein the first and second oscillators are low noise quartz oscillators.

18. The system of claim 15, wherein the first and second sets of configurable parameters each include an integer parameter, a fractional parameter and the modulus parameter.

19. The method of claim 18 further comprising:
  setting fixed values are set each of the configurable parameters in the second set of configurable parameters and for the integer parameter of the first set of configurable parameters, based on system requirements.

20. The method of claim 19, further comprising
  adjusting a value of the modulus parameter of the first set of configurable parameters to increase frequency resolution; and
  setting a fixed value for the fractional parameter of the first set of configurable parameters, based on system requirements.

21. The method of claim 19, further comprising
  adjusting a value of the fractional parameter of the first set of configurable parameters to increase frequency resolution; and
  setting a fixed value for the fractional parameter of the first set of configurable parameters, based on system requirements.

* * * * *